United States Patent [19]

Anantha et al.

[11] 4,160,991

[45] Jul. 10, 1979

[54] HIGH PERFORMANCE BIPOLAR DEVICE AND METHOD FOR MAKING SAME

[75] Inventors: Narasipur G. Anantha, Hopewell Junction; Harsaran S. Bhatia, Wappingers Falls; James L. Walsh, Hyde Park, all of N.Y.

[73] Assignee: International Business Machines Corporation, Armonk, N.Y.

[21] Appl. No.: 844,769

[22] Filed: Oct. 25, 1977

[51] Int. Cl.² .......................................... H01L 27/12
[52] U.S. Cl. ...................................... 357/49; 357/50; 357/52; 357/59; 357/68
[58] Field of Search .................. 357/59, 68, 49, 50, 357/52

[56] References Cited

PUBLICATIONS

IBM—Tech. Bull.—vol. 19, No. 12, May 1977, C. G. Jambotkar.

*Primary Examiner*—Edward J. Wojciechowicz
*Attorney, Agent, or Firm*—George O. Saile

[57] ABSTRACT

A method for manufacturing a high performance bipolar device and the resulting structure which has a very small emitter-base spacing is described. The small emitter-base spacing, reduces the base resistance compared to earlier device spacing and thereby improves the performance of the bipolar device. The method involves providing a silicon semiconductor body having regions of monocrystalline silicon isolated from one another by isolation regions and a buried subcollector therein. A base region is formed in the isolated monocrystalline silicon. A mask is formed on the surface of the silicon body covering those regions designated to be the emitter and collector reach-through regions. A doped polycrystalline silicon layer is then formed through the mask covering the base region and making ohmic contact thereto. An insulating layer is formed over the polysilicon layer. The mask is removed from those regions designated to be the emitter and collector reach-through regions. The emitter junction is then formed in the base region and the collector reach-through formed to contact the buried subcollector. Electrical contacts are made to the emitter and collector. The doped polycrystalline silicon layer is the electrical contact to the base regions.

8 Claims, 9 Drawing Figures

HIGH PERFORMANCE BIPOLAR DEVICE AND METHOD FOR MAKING SAME

BACKGROUND OF THE INVENTION

The invention relates to methods for fabricating high performance bipolar integrated circuits and the resulting integrated circuit device with small emitter-base spacing.

CROSS REFERENCE TO RELATED APPLICATIONS

N. Anantha et al patent application, Ser. No. 844,768, filed Oct. 25, 1977, filed simultaneously with this application, entitled "High Sheet Resistance Structure For High Density Integrated Circuits".

N. Anantha et al patent application, Ser. No. 844,767, filed Oct. 25, 1977, filed simultaneously with this application, entitled "Method for Fabricating Vertical NPN and PNP Structures and the Resulting Product".

DESCRIPTION OF THE PRIOR ART

In the monolithic integrated circuit technology, it is usually necessary to isolate various active and passive elements from one another in the integrated circuit structure. These devices have been isolated by back-biasing PN junctions, partial dielectric isolation and complete dielectric isolation. The dielectric materials used have been silicon dioxide, glass, and so forth. The preferred isolation for these active devices and circuits particularly as integration density has increased is some form of dielectric isolation. The dielectric isolation has substantial advantage over the PN junction isolation because it allows the abutting of the circuit elements against the isolation and thereby results in greater density of packing of the active and passive devices on the integrated circuit chip.

Isolated pockets of monolithic silicon is the result of the isolation process described in the previous paragraph. Active devices, such as bipolar transistors, FET transistors, and passive devices as resistors, diodes, and so forth, may then be formed in these monocrystalline silicon pockets. The essential steps in the formation of silicon planar devices may be seen, for example, in the book "Modern Microelectronics" by Max Fogiel published by Research and Education Assoc., 342 Madison Avenue, New York, N.Y. 10017, 1972 (See particularly pages 463–472). Briefly, the process involves obtaining, for example, a P substrate of silicon, oxidizing the surface, opening a window in the oxide using standard photolithography and etching techniques, diffusing an N+ buried region through the opening. The silicon dioxide is removed and an epitaxial layer of N-type silicon is grown thereover. During the epitaxial layer growth there is some outdiffusion of the buried layer into the epitaxial layer. The buried layer is destined to become the subcollector of an NPN transistor in this example. Another silicon dioxide is grown on the surface of the epitaxial layer, openings for isolation diffusion in the silicon dioxide are formed by photoresist and etching techniques, and the isolation diffusion or dielectric isolation is formed to isolate pockets of monocrystalline silicon. Openings are formed in the silicon dioxide coating where the base of the NPN transistor is to be formed and any P-type resistors are to be formed, and a P-type diffusion forms PN junctions in the N epitaxy layer. The surface is reoxidized and the use of photolithography and etching techniques made to open the regions in the mask destined to be the emitter and the collector reach-through. The emitter and reach-through diffusions are made. The surface is again oxidized. Openings are made in the silicon dioxide mask using conventional photolithography and etching techniques for the ohmic contact purposes. The entire surface is metallized, such as with aluminum film, and using conventional photolithography and etching techniques, the interconnections are formed through the etching away of the metal film.

Doped polycrystalline silicon have been used in place of metals such as aluminum, aluminum-copper and so forth for the ohmic contact to silicon regions. U.S. Pat. No. 3,664,896 to D. M. Duncan and U.S. Pat. No. 3,978,515 to W. J. Evans et al describe the use of polycrystalline silicon as contacts to regions in monocrystalline semiconductor devices. Published Japanese patent applications 50-1986, Appln No. 45-51721 (51721/70), filed June 15, 1970, inventor S. Yamazaki, and JA Patent Publication 51-36989, Application No. 45-113252 (113252/70) filed Dec. 17, 1970, inventor S. Yamazaki show, respectively, a metal insulator silicon field effect transistor device wherein the source, drain and gate electrodes are made of a conductive coating essentially consisting of the same material as the semiconductor substrate and a low doped semiconductor layer in a bipolar semiconductor transistor which acts as a conductive layer. "A 100 PS bipolar logic" by T. Sakai et al, published ISSCC '77 Feb. 18, 1977 Session XVI: High Speed Logic, pp 196 and 197 describes an elevated polycrystalline silicon electrode to be used as part of the circuit interconnection in a similar way to that of a silicon gate MOS integrated circuit. "Method for Reducing the Emitter-Base Contact Distance in Bipolar Transistors", C. G. Jambotkar, IBM TDB Vol. 19, No. 12, page 77 describes a high speed bipolar integrated circuit which uses P+ doped polysilicon for linking the base to base metallization and N+ polysilicon to link the emitter and collector reach-through metallization.

The performance of integrated circuits incorporating bipolar transistors is known to be sensitive to the spacing between the emitter and base contact. The spacing is determined by the semiconductor processing state of the art involving the photolithography techniques. In the conventional method of fabricating a bipolar device, the spacing between emitter and base contacts is determined by photolithography limitations and metal line to metal line spacing considerations. This distance determines the base resistance of the device and its performance in a switching circuit. This spacing is usually 4–6 $\mu m$ in devices fabricated by using photolithography. Electron beam photolithography can be used to reduce this distance to 2–3 $\mu m$. In the present invention method, this distance can be reduced to less than about 0.5 $\mu m$. Devices fabricated by this technique will have performance far superior to devices fabricated by conventional techniques. For example, the performance of conventional devices in a switching circuit is 400–500 picoseconds. Using the proposed techniques devices will perform in the range of 120–100 picoseconds or faster.

SUMMARY OF THE PRESENT INVENTION

In accordance with the present invention, a method for fabricating high performance semiconductor devices is described wherein a small emitter-base spacing in the bipolar transistors is obtainable. The method is initiated by providing a silicon semiconductor body having regions of monocrystalline silicon isolated from one another by preferably dielectric isolating regions. A base region is formed in certain of these isolated monocrystalline silicon regions by the usual diffusion or ion implantation techniques. Below the base has already been formed a subcollector region. A mask of a first and a second layer of different dielectric materials is formed over the silicon body. The mask covers those regions designated to be emitter and collector reach-through regions. A doped polysilicon layer is formed over the surface of the silicon body wherein the polysilicon layer makes ohmic contact to the base region. The polysilicon layer is then removed from over the mask. The second layer of the mask is also removed. A layer of material identical to that of the first layer of the mask is formed over the polysilicon layer. One material which would act very effectively as the first layer is silicon dioxide. A material which would act effectively as the second layer is silicon nitride. The first dielectric layer material is now removed from over the areas which are to be the emitter and collector reach-through. The emitter is then formed in the base region by diffusion or ion implantation techniques. The collector reach-through is formed so as to reach the subcollector by diffusion or ion implantation techniques. The electrical contacts are then made to the emitter and the collector reach-through regions. The polycrystalline silicon layer is already the electrical contact to the base region.

The use of the polycrystalline base contact with an oxidized layer thereover allows the base and emitter spacing to be as narrow as the oxide coating. The distance is in the order of less than about 0.4 $\mu$m. The performance of devices made by this process will be less than about 150 picoseconds. The process described with its use of a mask formed of two materials such as silicon dioxide and silicon nitride particularly allows such a structure to be formed.

The resulting structure is a silicon semiconductor body having regions of monocrystalline isolated, preferably by dielectric isolating regions. A subcollector region is within at least one of the regions of monocrystalline silicon. This subcollector region has a collector reach-through connecting the surface of at least one region of monocrystalline silicon with the subcollector region. A base region is spaced from the collector reach-through extending into the body from the surface of the silicon body. An emitter region within the base region extends from the surface of the body into the base region. An emitter ohmic contact is made to the emitter region. A base ohmic contact composed of doped polycrystalline silicon is made to the base region. This polycrystalline silicon contact to the base region is preferably surrounding the emitter contact. A collector ohmic contact is made to the collector reach-through.

DESCRIPTION OF THE PREFERRED EMBODIMENTS

Figure 1:
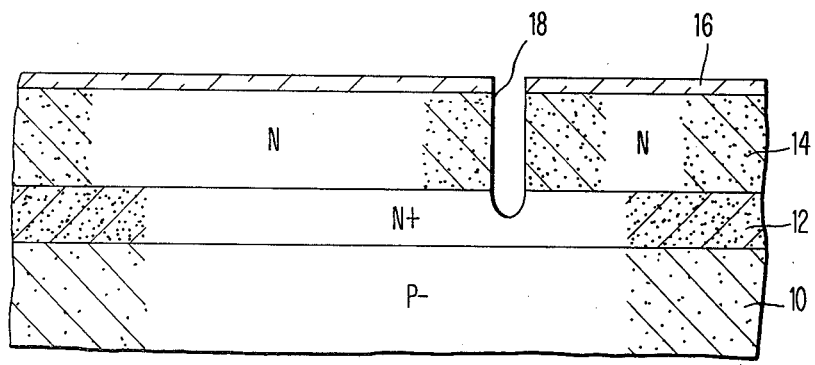
FIGS. 1-9 illustrate the method of fabricating one form of the high speed device of the present invention.

Referring now more particularly to FIGS. 1-9, the manufacturing steps for one form of the invention, the device is fabricated by starting with the wafer or substrate 10 of P− silicon monocrystalline material manufacturing process of this series of FIGURES results in an NPN bipolar transistor. It should, however, be evident to those skilled in the art that the conductivity types shown in the drawing is selected for illustrative purposes only and that the opposite conductivity type can be used. Further, the concentration of impurities can be increased or decreased as desired. The substrate 10 is fabricated, for example, by pulling a monocrystalline rod from a suitable melt containing a P-type material such as boron and using a seed crystal having a <100> crystallographic orientation. The resulting rod is then sliced into very thin wafers which also have the surface crystallographic orientation of <100>. The P− silicon wafer has preferably a resistivity of 10-20 ohms centimeter.

Referring now to FIG. 1, a region (not shown) of conductivity different from the substrate is then formed in the substrate 10. The region is preferably formed by ion implantation techniques but could alternatively be formed by the conventional diffusion processes. This region is formed by first, in the case of the silicon substrate, obtaining an insulating layer of silicon dioxide on the semiconductor surface by thermal oxidation. The preferred thickness of the silicon dioxide is 250 Angstroms. This thickness acts as a screen for the subsequent ion implantation step. The oxidized silicon wafer is then positioned in an ion implantation apparatus and subjected to arsenic ions at 50KeV and $1 \times 10^{16} \text{cm}^{-2}$ dosage for sufficient period of time to obtain an N+ layer (not shown). The structure is removed from the ion implanting apparatus and placed into a suitable heating apparatus wherein the ion implanted layer is heated, for example, at approximately 1100° C. for 5 min. in oxygen, then 70 min. in argon, 55 min. in steam, and 5 min. in oxygen. The effect of this heat treatment is to drive the arsenic further into the P− substrate and the further oxidation of the surface. The silicon dioxide surface layer is then removed by a suitable etching procedure.

The structure is then placed in an epitaxial growth chamber wherein an epitaxial layer 14 is grown on the surface of the substrate 10. The epitaxial layer may be any desired thickness, however, for the purpose of high performance devices of the type involved in the present invention, the thickness should be less than about 2 microns. The preferred thickness of the epitaxial layer is about 1.2 micrometers. Layer 14 is grown onto the substrate 10 by conventional techniques such as the use of $SiCl_4/H_2$ or $SiH_4/H_2$ mixtures of about 1000 to 1200° C. During the epitaxial growth the dopant in the N+ layer moves into the epitaxial layer. This results in the N+ layer 12 of FIG. 1 portions of which will serve as subcollector for the NPN transistor to be formed by the process of FIGS. 1-9.

The next series of steps is directed to the technique for reactive ion etching of the silicon structure. A silicon dioxide layer 16 is formed by conventional techniques of either thermal growth at a temperature of 970° C. in wet or dry oxygen ambient or by chemical vapor deposition. Other mask materials can also be used such as silicon nitride and aluminum oxide or combinations thereof. It is preferred that a 0.3 micrometer silicon dioxide coating be formed by a chemical vapor deposition using a mixture of silane and $N_2O$ at 800° C. in a nitrogen ambient. The initial recess oxidation step is directed to the formation of the base to subcollector reach-through isolation regions. A suitable opening is formed by conventional photolithography and etching techniques in the silicon dioxide 16 where the base to subcollector reach-through isolation regions are to be formed. The structure is then put into a reactive ion etching ambient. The process of this reactive ion etching may be more fully understood by reference to the J. N. Harvilchuck et al. patent application Ser. No. 594,413, filed July 9, 1975, continuation in part, patent application Ser. No. 822,775, filed Aug. 8, 1977 for "Reactive Ion Etching of Silicon". The RF induced plasma is reactive chlorine, bromine or iodine specie as specified in the Harvilchuck et al patent application. The thickness of the masking layer is between 2000-20,000 Angstroms, the exact thickness depending on the depth requirement of the silicon groove. A precise description of the RF discharge apparatus is given in the beforementioned patent application. The reactive ion etch or plasma ambient is preferably a combination of an innert gas such as argon and a chlorine specie. Application of suitable power is in the order of about 0.1-0.75 watts/cm$^2$ from an RF voltage source which produces sufficient power density to cause the reactive ion etching operation of silicon to be carried out at the suitable rate. The desired result of the etching is the opening 18 shown in FIG. 1 wherein the opening or channel at least partially penetrates through the N+ region 12.

Figure 2:
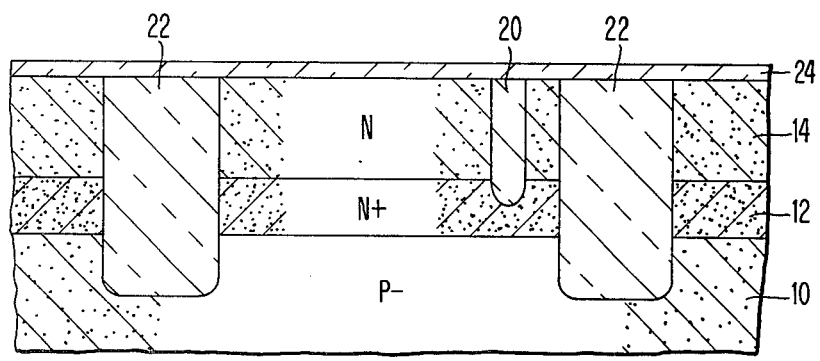

Referring now to FIG. 2, the second reactive ion etching procedure is to form isolation regions between the regions of monocrystalline silicon. The silicon dioxide coating 16 is removed by conventional etching techniques. Another layer of silicon dioxide is formed on the surface which is obtained preferably by pyrolytic deposition using a mixture of silane and N$_2$O in an N$_2$ ambient at 800° C. of a thickness of 0.6 to 0.8 micrometers. The opening 18 is filled with pyrolytic silicon dioxide during the deposition to form the isolating region 20.

Openings are now formed in the structure by conventional photolithography and etching techniques. The locations of the openings are where the desired dielectric isolation regions are to be formed which will isolate regions of monocrystalline silicon. As the structure is now placed in the reactive ion etching ambient as described in the previous paragraph. Reactive ion etching of the silicon occurs through the openings to the desired depth. It is preferred that the openings extend through the N+ region 12 into the substrate region 10. The preferred process for forming the channels or openings by reactive ion etching is given in the patent application Ser. No. 824,361, filed Aug. 15, 1977 to "Method for Forming Isolated Regions of Silicon" by J. A. Bondur and H. B. Pogge.

The next step in the process is to thermally oxidize the openings or channels by subjecting the body to an oxidation ambient which may be for example 970° C. in wet oxygen. The body is subjected to the ambient for about 10 to 30 minutes to produce the preferred silicon dioxide thickness within the opening or channel between about 500-2000 Angstroms. The purpose of the thermal oxide is to assure good silicon dioxide interface properties, the qualities of which are usually not as good with chemical vapor deposited dielectric material. Good quality dielectric material is necessary to permit the subsequent abutting of diffused junctions against the dielectric isolation. The complete filling of the opening with a suitable dielectric material is accomplished using vapor deposited silicon dioxide to produce filled opening 22. The details of this process is described in the beforementioned Bondur et al patent application.

It may be preferred in some instances, prior to pyrolytic deposition step to ion implant boron ions through the bottom of the oxide at the bottom of the channel. This causes the formation of the P+ region underneath the isolation region which prevents the P− region under the isolation region from inverting to an N type material.

The pyrolytic silicon dioxide is deposited in a thickness of preferably 2 to 3 micrometers. The preferred filling process is a chemical vapor deposition of silicon dioxide using gas mixtures of $CO_2/SiH_4/N_4$ or $N_2O/SiH_4/N_2$ between 800 and 1000° C. The typical deposition rate is to the order of 50-100 Angstroms per minute. The next step is the reactive ion etching of the chemical vapor deposited silicon dioxide layer to remove excess silicon dioxide from the surface. Details of this process is given in the Bondur et al patent application referred to above. FIG. 2 now shows the complete isolation of the desired monocrystalline silicon regions by means of dielectric isolation regions 22. The surface of the body is reoxidized by growth of 0.08 microns of thermal oxide to bring the silicon dioxide layer 24 to the desired thickness.

Figure 3:
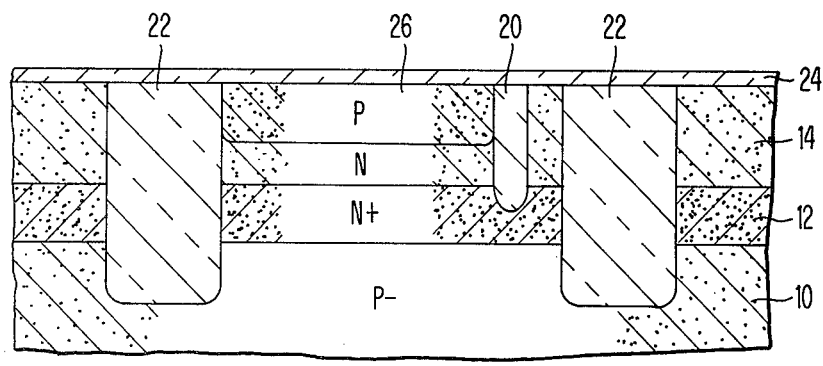

Referring now to FIG. 3, the base region is to be formed in the isolated monocrystalline silicon regions. The base opening is formed in the silicon dioxide layer 24 by suitable photolithography and etching techniques to expose the silicon surface. The structure is put into an ion implantation apparatus wherein boron is implanted into the base region using a 100 KeV and a $1.5 \times 10^{14}$ ions/cm$^2$ dosage of boron. This process results in the base region 26 being formed. It is preferred that the base abut the dielectric isolation regions. The silicon dioxide layer 24 is then removed by suitable etching techniques. One suitable method was CF$_4$ with a gas pressure of from 10-70 micrometers with gas flow rates of 2 to 50 cc/min. The RF power level runs from 0.1 watts/cm$^2$.

Figure 4:
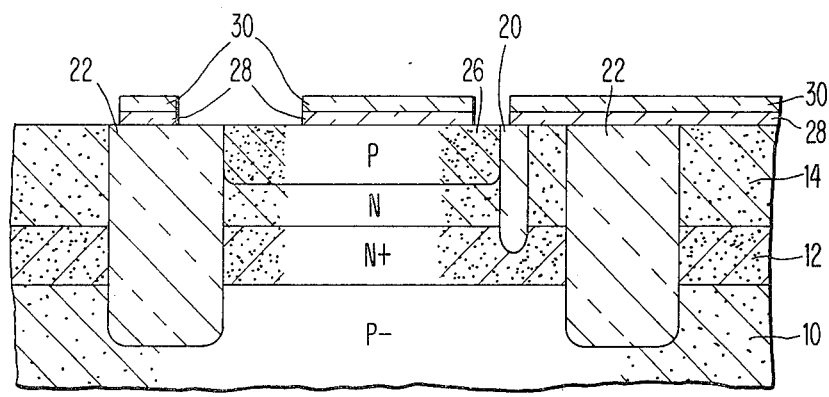
Figure 5:
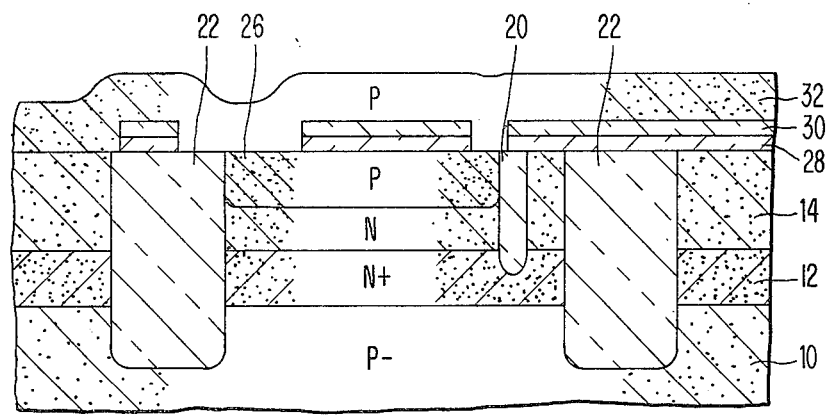

Referring now to FIG. 4, a new silicon dioxide layer 28 preferably of approximately 300 Angstroms is formed. This layer may be formed by chemical vapor deposition or by thermal oxidation of the silicon surface. Thereafter, a layer 30 of silicon nitride, preferably approximately 300 Angstroms units, is formed over the silicon dioxide layer. The silicon nitride layer is formed by RF sputtering or preferably by pyrolytic deposition from a mixture of silane and ammonia in N$_2$ ambient at 800° C. Other combinations of a different dielectric materials other than silicon dioxide and silicon nitride are of course possible, for example, aluminum oxide, thick silicon dioxide and/or combinations of silicon dioxide and silicon nitride may be used. Photolithography and etching techniques are then used to etch portions of the silicon dioxide 28 and silicon nitride film 30 from the surface of the structure. The regions that now remain that are masked with the layers of silicon dioxide 28 and silicon nitride 30 are those regions designated to be the emitter and collector reach-through regions.

A coating 32 of P doped silicon is now deposited over the entire wafer by using a mixture of silane and diborane in an hydrogen ambient at 800° C. Other P type dopants can alternatively be used. The operative thickness of the silicon is between about 1000 to 10,000 Angstroms with 5000 Angstroms preferred. Should the thickness be greater than about 10,000 Angstroms, planarity problems arise and make it difficult to fabricate high circuit density chips. If the thickness is less than about 1000 Angstroms, the resistance of the polysilicon layer becomes significant to adversely effect the performance of the device. The preferred doping level is between about $10^{19}$ to $10^{21}$ atoms/cm$^2$. Photolithography and etching techniques are utilized to remove the silicon layer 32 from over any Schottky Barrier contacts, emitter and collector reach-through areas. A layer 34 of silicon dioxide is then grown over the layer 32. The preferred thickness of the silicon dioxide 34 layer is approximately 2000 Angstroms.

Photoresist is now applied on the surface of layer 34, exposed, developed and baked to act as a mask for a reactive ion etching of the 300 Angstrom silicon nitride layer 30 and 300 Angstrom silicon dioxide layer 28 over the emitter and reach-through contacts. The reactive ion etching is done in a diode type system with $CF_4$ gas at 30-40 μm pressure and at a flow rate of about 2-3 cc/mm with a power dissipation of about 0.3 watts/cm$^2$ at room temperature.

Figure 6:
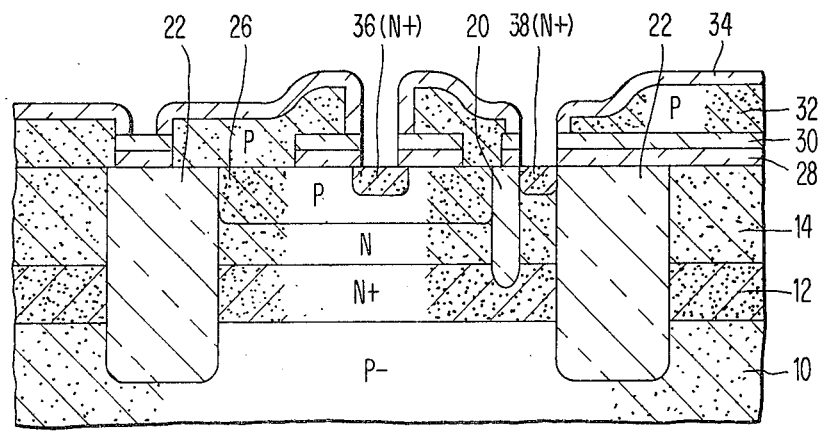

The structure is now placed in a suitable ion implantation apparatus where the emitter and collector reach-through implantations are made. The preferred implant material is arsenic and its dosage is $1 \times 10^{15}$ atoms/cm$^2$ and the power required is 40 KeV. The resulting structure is shown in FIG. 6 wherein the emitter is 36 and the collector reach-through is 38. The structure is now taken from the ion implantation apparatus and put into a heat treating apparatus. The structure is heat treated at an elevated temperature such as 1000° for 5 minutes in oxygen and then 30 minutes in nitrogen. This causes the drive-in of the impurities in the emitter region 36 of the collector reach-through region 38.

Figure 7:
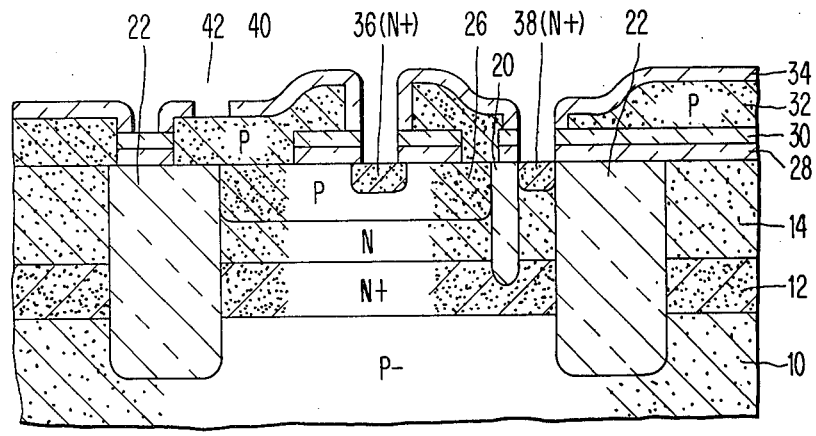

Conventional photolithography steps are made to provide a photoresist mask on the surface of the silicon dioxide coating 34 which will open a contact to the base region P doped silicon ohmic contact 40 as shown in FIG. 7 wherein an opening 42 has been obtained in the silicon dioxide layer 34 by a reactive ion etching step. The reactive ion etching of a silicon dioxide material is done using $CF_4$ gas at 30-40 μm pressure and at flow rate of about 2-3 cc/minute.

Figure 8:
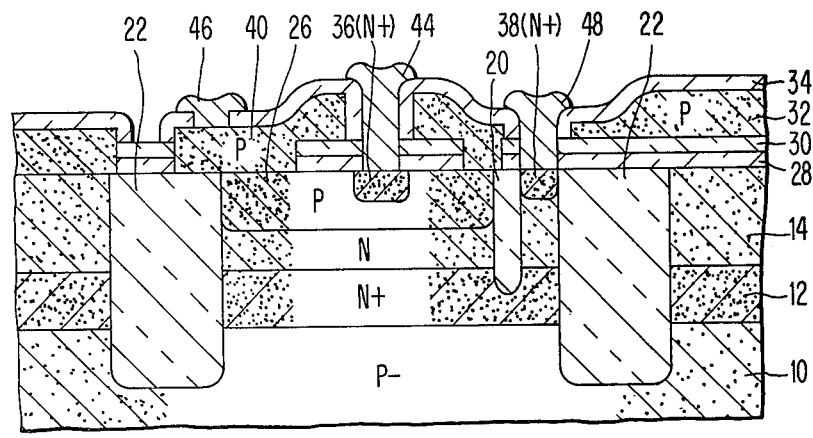
Figure 9:
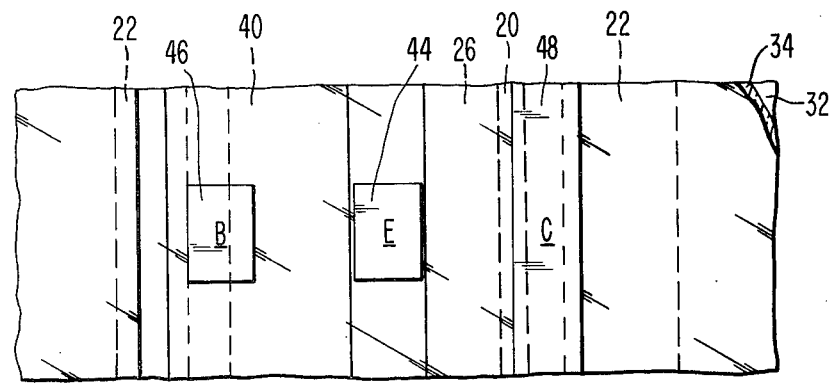

A suitable ohmic contact metal is then evaporated or deposited by other means onto the upper surface of the structure. A typical contact material is aluminum or aluminum copper. However, other well known materials in the art can be used such as platinum, paladium, molybdenum, and so forth. Photolithography and etching techniques are utilized to form the desired conductive lines on the surface of the semiconductor structure. FIG. 8 illustrates the completed NPN transistor structure by the present process wherein the emitter contact is 44, the base contact is 40, the second level base contact is 46 and the collector reach-through contact is 48. FIGS. 9 shows the planar view of the FIG. 8 structure.

The resulting structure is FIGS. 8 and 9 has the substantial advantage that the base to emitter spacing is less than about 0.5 microns. This is allowed because of the use of the doped polysilicon contact which preferably surrounds the emitter contact. The device size is also reduced because of this design. The circuit layout utilizing this structure is also simple because the base contact metal is parallel to the emitter and collector metals. The base contact provided by the polysilicon surrounds the emitter on all sides and makes the injection from the emitter uniform on all sides. This structure thereby increases the efficiency of the emitter. Also, the heavily doped polysilicon layer provides an extrinsic base diffusion source. This eliminates the need for extrinsic base diffusion in shallow junction transistors. The emitter width and length dimensions are less than about 2 microns and the emitter-base spacing is less than about 0.5 microns.

While the invention has been particularly shown and described with reference to the preferred embodiments thereof, it will be understood by those skilled in the art that various changes in form and detail may be made therein without departing from the spirit and scope of the invention.

What is claimed is:

1. A high performance semiconductor device with small emitter-base spacing comprising:
   a silicon semiconductor body having regions of monocrystalline silicon isolated from one another by isolating regions;
   a subcollector region within at least one of said regions of monocrystalline silicon;
   first and second insulator layers over portions of said monocrystalline silicon;
   a doped polycrystalline silicon layer over said second insulator layer with openings in said polycrystalline silicon layer to said monocrystalline surface only where an emitter contact and a collector reach-through are to be made;
   a third insulator layer over said polycrystalline silicon layer;
   a collector reach-through connecting the surface of said at least one regions of monocrystalline silicon with said subcollector region;
   a base region spaced from said collector reach-through extending into said body from the surface of said body;
   an emitter region within said base region extending from the surface of said body into said base region;
   an emitter ohmic contact to said emitter region through said opening in said polycrystalline silicon layer;
   a base ohmic contact composed of said doped polycrystalline silicon to said base region through openings in said first and second insulator layers;
   said base contact being dielectrically isolated from and surrounding said emitter contact by said third insulator layer; and
   a collector ohmic contact to said collector reach-through.

2. The device of claim 1 wherein said isolating regions are composed of dielectric material.

3. The device of claim 2 wherein said dielectric material is silicon dioxide.

4. The device of claim 2 wherein a dielectric isolating region isolates the said collector reach-through from said base region.

5. The device of claim 4 wherein the said base region abuts said isolating regions.

6. The device of claim 1 wherein said doped polysilicon layer is between about 1000 to 10,000 Angstroms in thickness and is doped with boron between about $10^{19}$ to $10^{21}$ atoms/cc.

7. The device of claim 6 wherein the device formed is an NPN transistor.

8. The device of claim 6 wherein the emitter width and length dimensions are less than about two by two microns and the said emitter-base spacing is less than about 0.5 microns.

* * * * *